United States Patent [19]

Asla et al.

[11] Patent Number: 5,775,568

[45] Date of Patent: Jul. 7, 1998

[54] WAVE SOLDER METHOD FOR ATTACHING COMPONENTS TO A PRINTED CIRCUIT BOARD

[75] Inventors: Jess Asla; Roy Lange; Ron Despain. all of Boise, Id.

[73] Assignee: Micron Custom Manufacturing Services, Inc., Nampa, Id.

[21] Appl. No.: 686,781

[22] Filed: Jul. 26, 1996

Related U.S. Application Data

[63] Continuation of Ser. No. 324,087, Oct. 14, 1994, Pat. No. 5,540,376.

[51] Int. Cl.$^6$ ..................................................... H05K 3/34
[52] U.S. Cl. ........................................ 228/180.1; 228/260
[58] Field of Search .......................... 228/37, 43, 180.1, 228/260; 427/96, 123; 118/410

[56] References Cited

U.S. PATENT DOCUMENTS

| | | | |
|---|---|---|---|
| 5,024,370 | 6/1991 | Yakota | 228/180.1 |
| 5,067,433 | 11/1991 | Doll, Jr. et al. | 228/37 |
| 5,067,648 | 11/1991 | Caseini | 228/43 |
| 5,540,376 | 7/1996 | Asla et al. | 228/37 |

FOREIGN PATENT DOCUMENTS

| | | | |
|---|---|---|---|
| 2-258161 | 10/1990 | Japan | 228/37 |
| 2 226 969 | 7/1990 | United Kingdom | 228/37 |

OTHER PUBLICATIONS

Research Disclosure–March 1992 No. 335–57, Kenneth Mason Publications Ltd, England.

*Primary Examiner*—Samuel M. Heinrich

[57] ABSTRACT

A method for wave soldering comprises the steps of providing a circuit board having a plurality of electronic components thereon and providing a pallet comprising a frame. first and second parallel rails attached to the frame, and third and fourth rails for receiving the circuit board. The third and fourth rails are attached to the first and second rails and the third and fourth rails form an angle of between about 30° and 60° with the first and second rails. Next, a solder wave is provided which generally flows in a first direction. Finally, the pallet is moved in a second direction generally perpendicular with the first direction across the solder wave. The components are therefore positioned at an angle with respect to the solder wave and solder-related electrical defects are reduced.

11 Claims, 4 Drawing Sheets

WAVE SOLDER METHOD FOR ATTACHING COMPONENTS TO A PRINTED CIRCUIT BOARD

NOTICE OF CONTINUATION

This is a continuation of U.S. patent application Ser. No. 08/324,087, filed Oct. 14, 1994, now U.S. Pat. No. 5,540,376

FIELD OF THE INVENTION

The invention relates to printed circuit board assembly, and more specifically to a pallet for use during wave soldering of devices onto the printed circuit board.

BACKGROUND OF THE INVENTION

A common step used during the assembly of active and passive devices onto a printed circuit board (PCB) is a wave solder step. Wave soldering devices onto the PCB provides an automated method of interconnecting leads on the devices to solder pads on the PCB.

Referring to FIG. 1, during a typical wave solder operation a pallet 10 receives at least one PCB 12, and is placed on a conveyor (not shown) which moves the PCB along the wave solder machine (not shown). The wave solder generally comprises three steps: A fluxer applies flux to the bottom side of the PCB to prepare or clean the solder pad surfaces so the solder will adhere, then the PCB is preheated. Finally, the PCB is moved to the solder wave for electrical connection of the leads on the devices to the solder pads on the PCB.

Problems which can result from wave soldering include the formation of shorts and shadowing. Shorts occur when solder bridges two adjacent solder pads, and shadowing occurs when a trailing solder pad is not supplied adequate solder due to the influence of another pad on the flow of the solder wave. With shadowing, a weak solder connection is formed on the trailing pad which can cause the PCB to fail during testing, or the PCB may pass testing but fail during use. An apparatus which reduces shorts and shadowing would be desirable.

U.S. Pat. No. 5,024,370, which is incorporated herein by reference, describes a wave solder apparatus.

SUMMARY OF THE INVENTION

An embodiment of the present invention provides a new method for wave soldering components onto a printed circuit board which may reduce solder-related electrical defects. The method provides for electrical components to be moved across a solder wave at an angle preferably between about 30° and 60° with respect to a direction of flow of the solder wave. This can be accomplished using a pallet for a printed circuit board as described herein.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENTS

Figure 1:
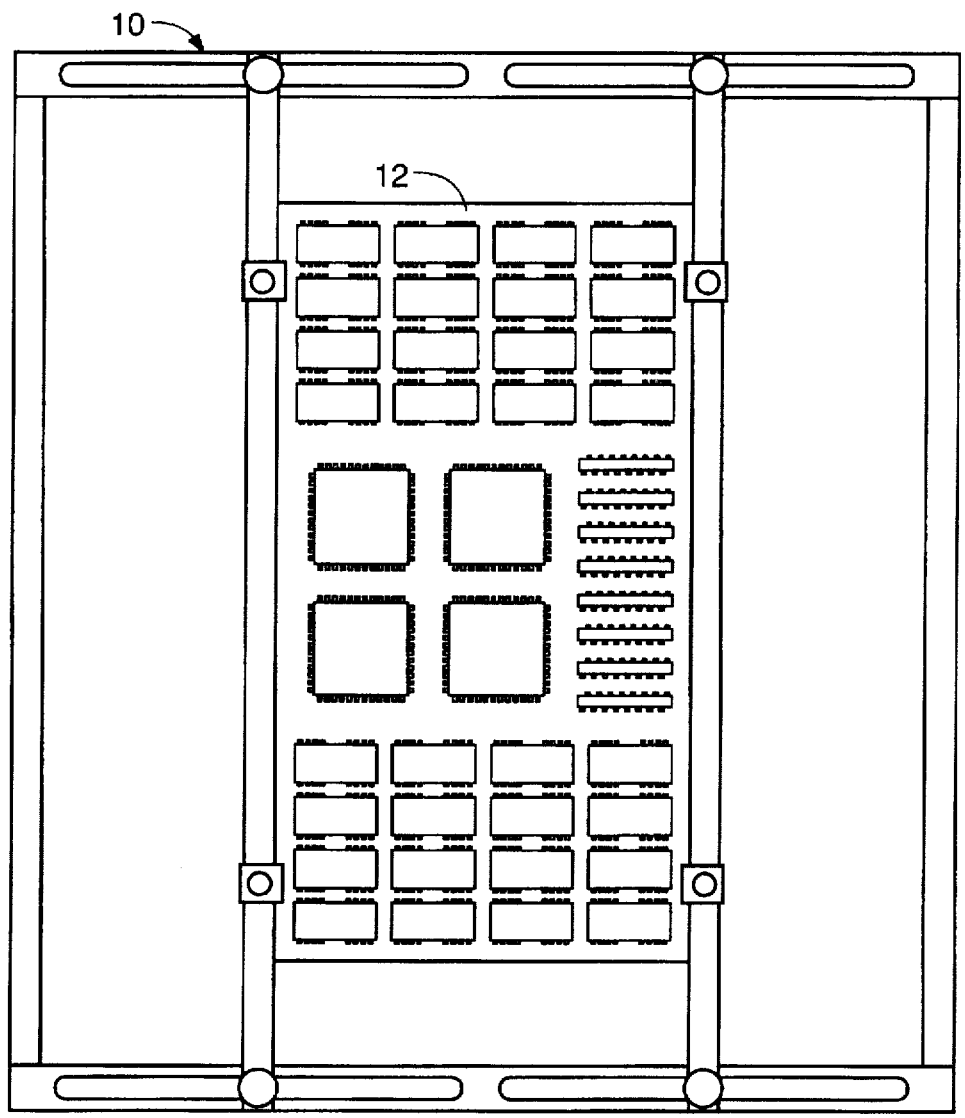
FIG. 1 is a top view of a conventional wave solder pallet with a printed circuit board mounted thereto.
Figure 2:
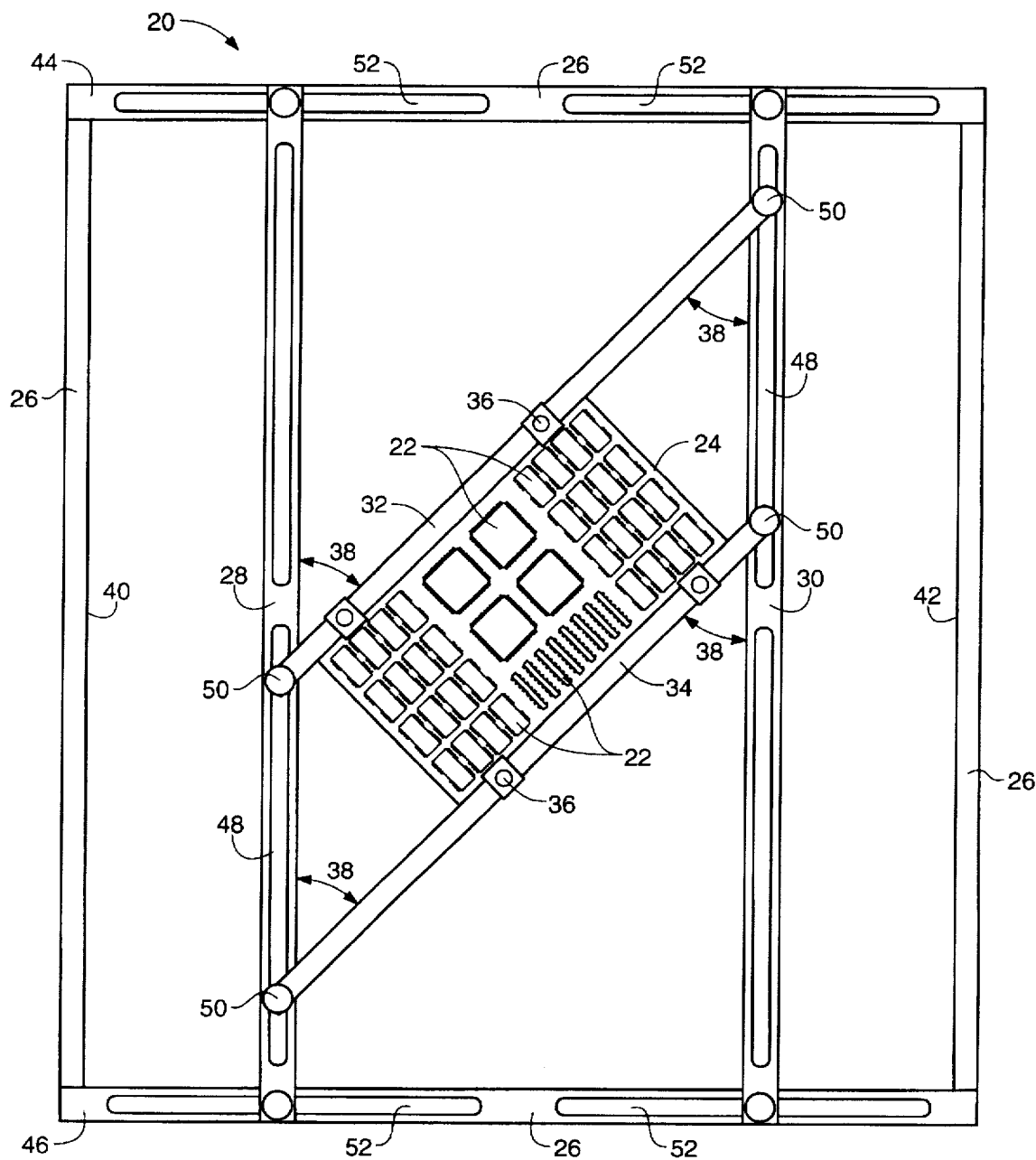
FIG. 2 is a top view of a first embodiment of the inventive pallet and a printed circuit board.

As shown in FIG. 2, a pallet 20 for use during wave soldering of devices 22 to a printed circuit board (PCB) 24 comprises a rectangular frame 26, first 28 and second 30 parallel rails attached to the frame 26, and third 32 and fourth 34 rails for receiving the PCB 24. The third 32 and fourth 34 rails can be adjustably attached to the first 28 and second 30 rails such that PCBs of varying size, or more than one PCB, can be received by the pallet. An attachment 36 secures the PCB to the third and fourth rails, such as by bolting the PCB to the rails, or by other workable means. It was found that when the third and fourth rails formed an angle 38 of about 45° with the first and second rails, shorts and shadowing were substantially reduced. Angles of between about 30° and 60° may also produce sufficient results.

The frame can comprise fifth 40, sixth 42, seventh 44, and eighth 46 rails or, as an equivalent, could be manufactured as a single piece. Slots 48 formed in the first 28 and second 30 rails allow the third 32 and fourth 34 rails to be adjustably attached to the first and second rails through the slots, for example using pins, bolts, rivets, etc. 50, and similar slots 52 in the frame 26 can be used to adjustably attach the first and second rails to the frame such that PCBs of varying size can be received by the pallet by adjusting the position of the pins in the rails.

Figure 3:
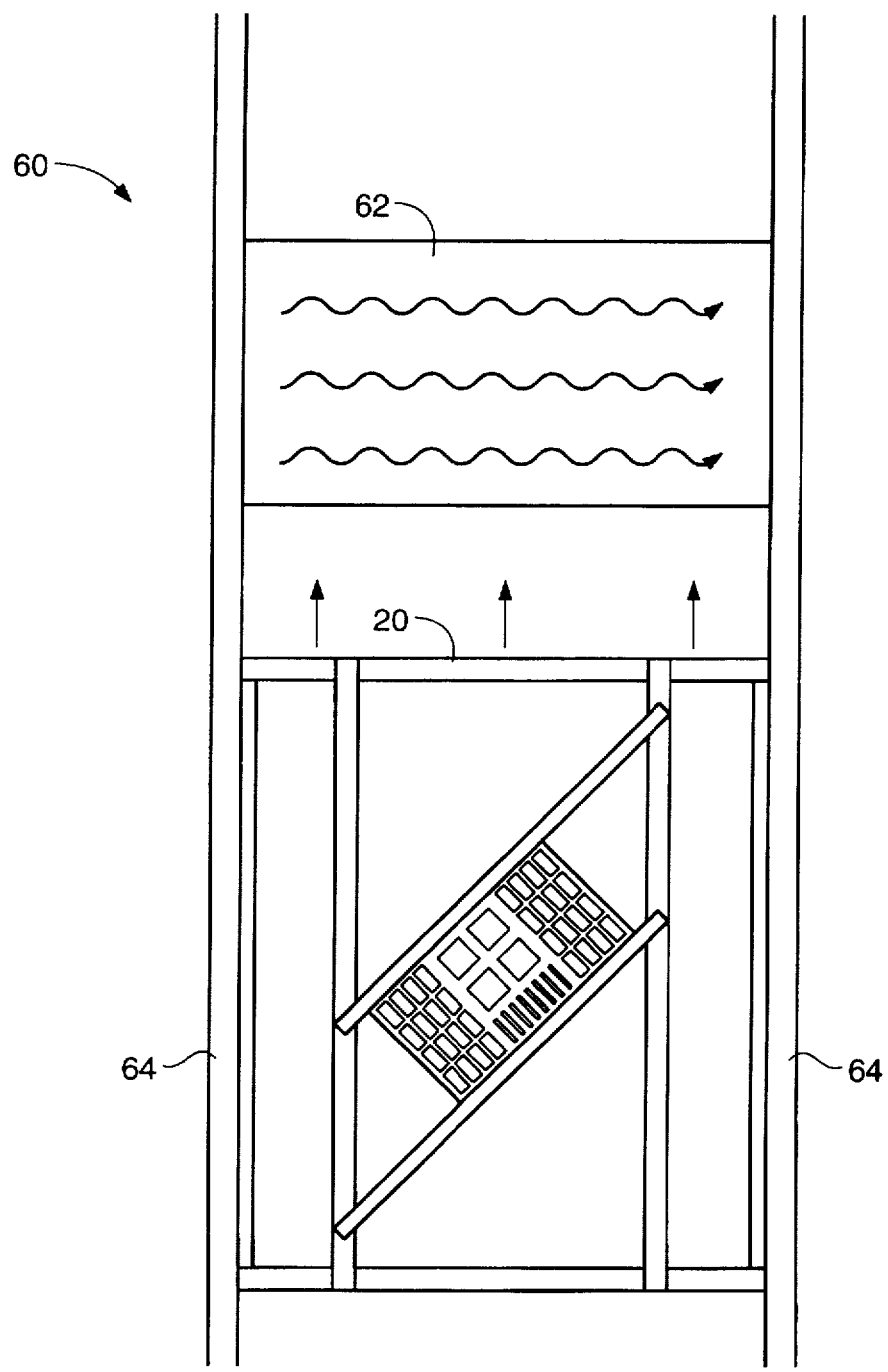
FIG. 3 shows a portion of a wave solder machine and FIG. 4 shows a top view of a second embodiment of the inventive pallet.

A portion of a wave solder machine is shown in FIG. 3. During use, the wave solder machine 60 comprises a reservoir of solder 62, the solder generally flowing in a first direction. The pallet 20 as described is received by a conveyor 64 for moving the pallet in a second direction which is perpendicular to the first direction. As the conveyor moves the PCB across the solder wave, the devices on the PCB are at an angle of between about 30° and 60° to the solder wave. The flow of the solder across the devices and the solder pads is substantially different with the inventive pallet, which results in the devices being at an angle of between about 30° and 60° to the solder wave, than a conventional pallet which results in the devices being at an angle of either 0° or 90° with the solder wave. This difference in the angle was found to result in fewer shorts and less shadowing.

Figure 4:
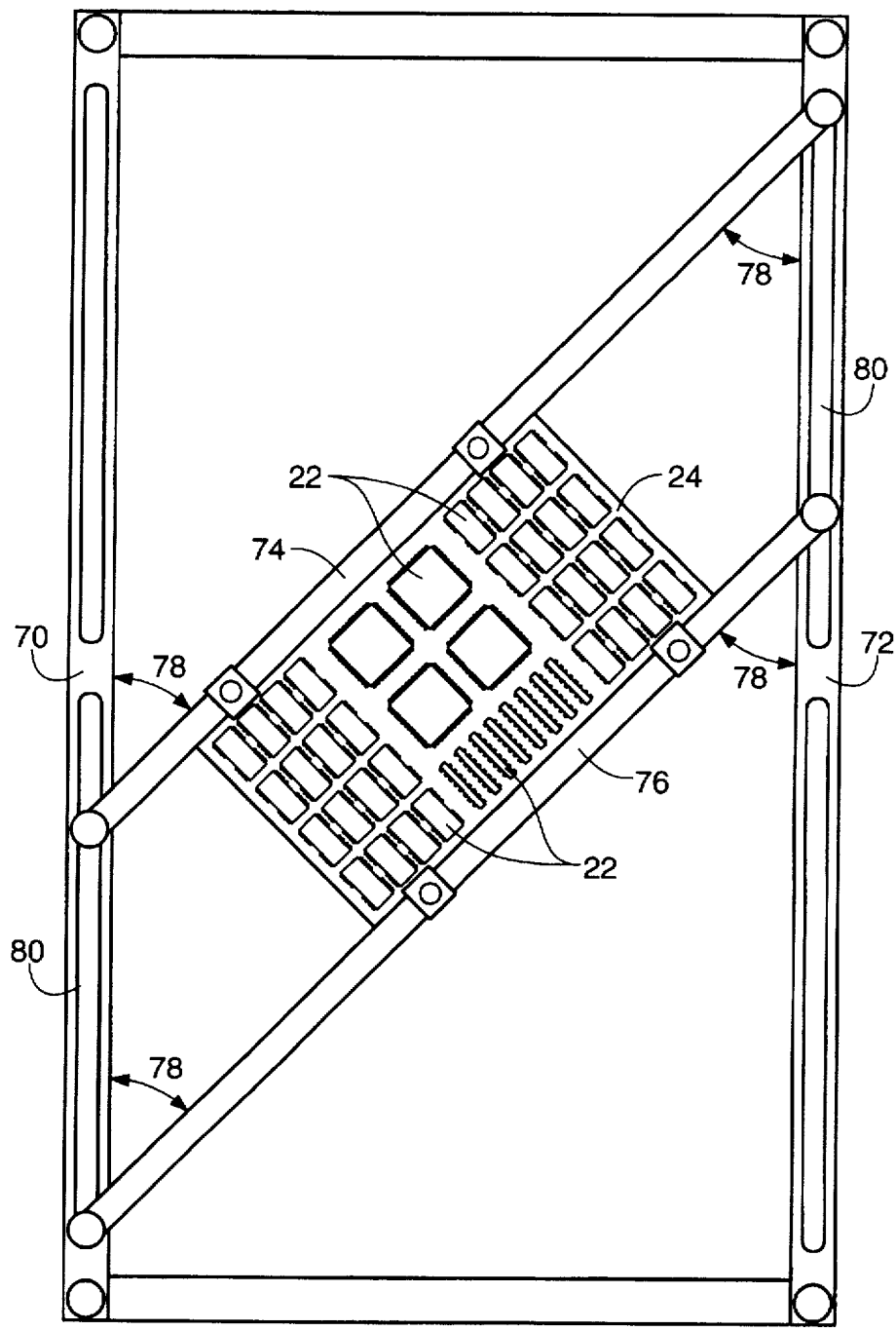

FIG. 4 shows a second embodiment of an inventive pallet. In this embodiment the pallet comprises first 70 and second 72 rails, the rails being parallel to each other, and third 74 and fourth 76 parallel rails each having first and second ends. The third 74 and fourth 76 rails form an angle 78 of about 45° with the first and second rails, with the first and second ends of the third and fourth rails being connected to one of the first and second rails as shown. The first and second rails can comprise slots 80 for adjustably positioning the first and second ends of the third and fourth rails. An angle of between about 30° and 60° formed by the third and fourth rails and the first and second rails could produce sufficient results.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for electrically coupling an electronic component to a circuit board comprising the following steps:

providing at least one electronic component having at least one row of conductive leads aligned in a first direction;

providing a solder wave moving in a generally second direction;

moving said electronic component across said solder wave in a third direction generally perpendicular with said second direction, wherein said first direction forms an angle of between about 30° and about 60° with said second direction.

2. The method of claim 1 wherein said electronic component is one of a plurality of electronic components further comprising the step of mounting said plurality of electronic components to a circuit board.

3. The method of claim 2 further comprising the step of mounting said printed circuit board to a pallet.

4. The method of claim 3 wherein said pallet comprises a rectangular frame, first and second parallel rails attached to said frame, and third and fourth rails for receiving said workpiece, said third and fourth rails being attached to said first and second rails, said third and fourth rails forming an angle of between about 30° and 60° with said first and second rails.

5. A method for wave soldering, comprising:

providing a circuit board having a plurality of electronic components thereon;

providing a pallet comprising a frame, first and second parallel rails attached to said frame, and third and fourth rails for receiving said circuit board, said third and fourth rails being attached to said first and second rails, said third and fourth rails forming an angle of between about 30° and 60° with said first and second rails;

providing a solder wave generally flowing in a first direction;

moving said pallet in a second direction generally perpendicular with said first direction across said solder wave.

6. The method of claim 5 wherein said angle is about 45°.

7. The method of claim 5 further comprising the step of perpendicularly aligning said first and second rails with said first direction.

8. A method for electrically coupling an electronic component to a component support comprising the following steps:

providing at least one electronic component;

providing a component support having first and second generally parallel edges;

placing said component on said component support;

providing a solder wave generally flowing in a first direction; and moving said component support and said electronic component across said solder wave in a second direction generally perpendicular to said first direction, said parallel edges forming an angle of between about 30° and about 60° with said first direction, wherein said solder wave electrically couples said electronic component to said component support.

9. The method of claim 8 further comprising the step of mounting said component support to a pallet prior to said step of moving said component support across said solder wave.

10. The method of claim 9 wherein said pallet comprises a rectangular frame, first and second parallel rails attached to said frame, and third and fourth rails for receiving said component support, said third and fourth rails being attached to said first and second rails, said third and fourth rails forming an angle of between about 30° and 60° with said first and second rails.

11. The method of claim 8 wherein said angle is about 45°.

* * * * *